United States Patent
Stephens et al.

(10) Patent No.: US 8,793,627 B1
(45) Date of Patent: Jul. 29, 2014

(54) VIA NON-STANDARD LIMITING PARAMETERS

(71) Applicants: Jason E. Stephens, Beacon, NY (US); Marc Tarabbia, Pleasant Valley, NY (US)

(72) Inventors: Jason E. Stephens, Beacon, NY (US); Marc Tarabbia, Pleasant Valley, NY (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 13/837,624

(22) Filed: Mar. 15, 2013

(51) Int. Cl.
   *G06F 17/50* (2006.01)

(52) U.S. Cl.
   USPC ............................. 716/52; 716/56; 716/122

(58) Field of Classification Search
   USPC ............................................. 716/52, 56, 122
   See application file for complete search history.

(56) References Cited

U.S. PATENT DOCUMENTS

| | | | |
|---|---|---|---|
| 6,275,971 B1 * | 8/2001 | Levy et al. | 716/136 |
| 6,548,902 B2 * | 4/2003 | Suzuki et al. | 257/758 |
| 7,076,749 B2 * | 7/2006 | Kemerer et al. | 716/52 |
| 7,301,241 B2 * | 11/2007 | Watanabe | 257/775 |
| 7,457,736 B2 * | 11/2008 | Chang | 703/13 |

* cited by examiner

*Primary Examiner* — Naum Levin
(74) *Attorney, Agent, or Firm* — Ditthavong & Steiner, P.C.

(57) ABSTRACT

Methodology enabling designs with a reduced V0 distance to M1 inner vertex restriction is disclosed. Embodiments include determining a limiting parameter $\alpha$ for manufacture of an SAV proximate to an M1 inner vertex; defining a coordinate system in terms of horizontal and vertical distances x and y, respectively, between the SAV and the M1 inner vertex angle; calculating $\alpha$ as a function of x and y; simulating the calculation of $\alpha$ as a function of x and y; calculating a baseline angle $\alpha1$ as a function of x and y; simulating calculation of the baseline angle $\alpha1$ as a function of x and y; extracting a $3\sigma$ value of the baseline angle $\alpha1$ from the simulation; and designing a semiconductor cell with an SAV proximate to an M1 inner vertex, the cell having a limiting parameter $\alpha$ minimum value equal to the $3\sigma$ value of the baseline angle $\alpha1$.

21 Claims, 9 Drawing Sheets

VIA NON-STANDARD LIMITING PARAMETERS

TECHNICAL FIELD

The present disclosure relates to semiconductor fabrication, and specifically to fabrication of semiconductor vias to a metal 1 (M1) layer. The present disclosure is particularly applicable to self-aligned vias (SAVs) for 20 nanometer (nm) technologies.

BACKGROUND

The introduction of the SAV process in the 20 nm technology node took advantage of the trench first process in addition to a trench hard mask to bound the via critical dimension (CD) at the edges of the metal hard mask where the via CD would overlap those metal edges. An SAV via process uses the "AND" of the metal hard mask opening and via pattern opening to form the final on wafer via shape that will be etched and then filled along with the metal trenches. An important benefit of the SAV process is that it eliminates the risk of an SAV via shorting to any adjacent metal lines in the direction of the SAV edges due to overlay, CD, and line edge roughness (LER) variability of the via. This is especially true as the pitch of the metal interconnects, polysilicon gates, and local interconnects become increasingly smaller. With the ever shrinking standard cell, pin accessibility becomes more limited, metal interconnect and local interconnect shapes become extremely congested, and the need for more aggressive and risky design rules becomes paramount.

Design rules are implemented to protect against a known limiting parameter and its failure mechanism, which can be calculated, measured, simulated, or modeled. The standard limiting parameters (SLPs) known to exist in past technologies include minimum polygon dimensions, printability of polygon shapes, inter and intra level polygon spacing, intersect area between two connecting shapes from adjacent levels, etc. For each SLP and respective failure criteria, design rule restrictions can be derived from ground rule calculations, 2-D litho simulations, Monte-Carlo intersect area modeling/simulations which are based on statistically predicted manufacturing environment process variables, such as CD tolerances, overlay tolerances, LER tolerances, and corner rounding estimates, etc.

In the 20 nm technology node, there have been many challenges trying to reach a competitive standard cell density. The usual SLPs have been pushed to the limits with the intent to enable a competitive standard cell design but have fallen short. Design analysis has shown that one design rule in particular is identified as a key blocking point in the development of a competitive standard cell height. This design rule restricts the via 0 (V0) distance to an M1 inner-vertex, which is based on a new concern that is unique to the SAV process, and which will be call a non-standard limiting parameter (NSLP) throughout this disclosure.

Figure 1A:
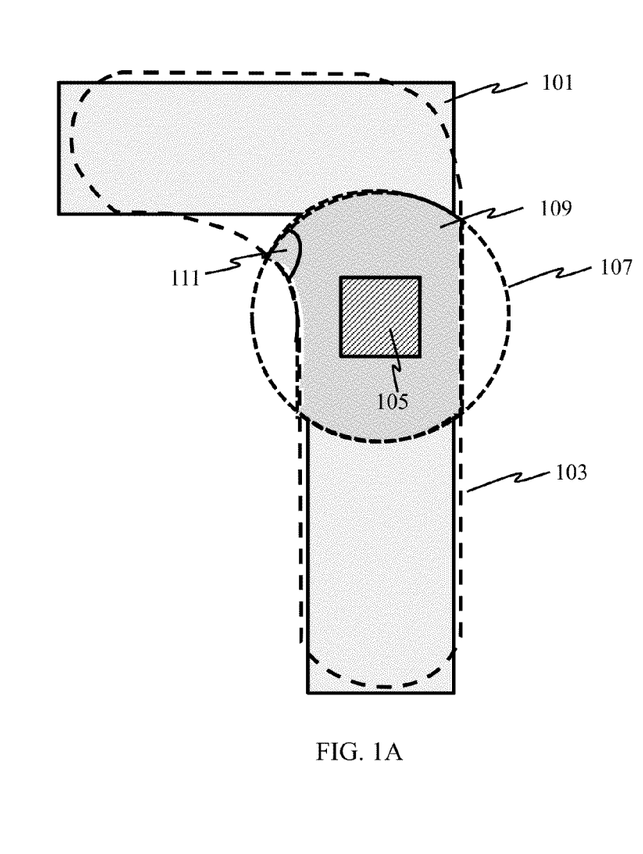
FIG. 1A schematically illustrate an M1 with an inner vertex angle an SAV and FIG. 1B illustrates the final SAV shape, in accordance with an exemplary embodiment.

This NSLP is an acute angle created in the final via shape opening that will be etched and filled with metal. This acute angle can be a result of the interaction between the SAV pattern and the metal hard mask, forming a final top down shape that is the AND of both, as illustrated in FIG. 1A. Specifically, a drawn M1 shape 101 has a final hard mask CD shape 103, and a drawn V0 105 has a V0 retargeted litho shape 107. The intersection between the final hard mask CD shape 103 and the V0 retargeted litho shape 107 is the final V0 shape 109 (shown separately in FIG. 1B). The acute angle 111 in the final V0 shape 109 is the NSLP, or limiting parameter $\alpha$.

Figure 1B:
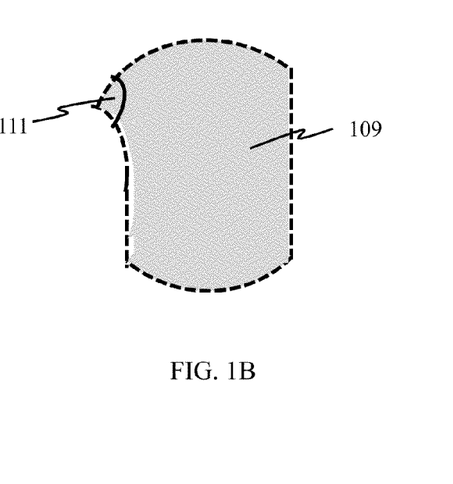

The concern for integration teams is that the final V0 inner angle $\alpha$, angle 111, created between V0 and the M1 hard mask, will be a yield concern with the failure criteria being the ability to properly fill the via. In particular, acute angles can create voids when depositing metal and eventually, if not immediately, create electrical opens.

A need therefore exists for methodology enabling designs with a reduced V0 distance to M1 inner vertex restriction.

SUMMARY

An aspect of the present disclosure is a method for determining a limiting parameter and designing a semiconductor cell with reduced design restrictions.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: determining a limiting parameter $\alpha$ for manufacture of an SAV proximate to an M1 inner vertex; defining a coordinate system in terms of horizontal and vertical distances x and y, respectively, between the SAV and the M1 inner vertex angle; calculating the limiting parameter $\alpha$ as a function of x and y; simulating the calculation of $\alpha$ as a function of x and y; calculating a baseline angle $\alpha 1$ as a function of x and y; simulating calculation of the baseline angle $\alpha 1$ as a function of x and y; extracting a $3\sigma$ value of the baseline angle $\alpha 1$ from the simulation; and designing a semiconductor cell with an SAV proximate to an M1 inner vertex, the cell having a limiting parameter $\alpha$ minimum value equal to the $3\sigma$ value of the baseline angle $\alpha 1$.

Aspects of the present disclosure include determining the limiting parameter $\alpha$ by: drawing an M1 shape; determining a final hard mask for M1; drawing a via; determining a via retargeted litho shape; and setting as the limiting parameter $\alpha$ an angle formed between and within the via retargeted litho shape and the final hardmask for M1. Further aspects include calculating the limiting parameter $\alpha$ by determining a corner rounding circle approximating a curve at an inner vertex of the final hard mask and employing geometric and algebraic principles. Other aspects include creating a probability distribution to statistically represent manufacture of M1 and the SAV from the simulation of the calculation of the limiting parameter $\alpha$. An additional aspect includes simulating the calculation of the limiting parameter $\alpha$ with overly tolerance variations. Another aspect includes simulating the calculation of the limiting parameter $\alpha$ with CD tolerance variations. A further aspect includes simulating the calculation of the limiting parameter $\alpha$ with LER tolerance variations. Other aspects include plotting $3\sigma$ contours from the simulation of the calculation of the limiting parameter $\alpha$. Additional aspects include locating the $3\sigma$ value of the baseline angle $\alpha 1$ on the $3\sigma$ contours and designating a value of x corresponding the $3\sigma$ value of the baseline angle $\alpha 1$ as the minimum manufacturable distance between the SAV and the M1 inner vertex.

Another aspect of the present disclosure is a method including drawing an M1 shape having an inner vertex; drawing a via (V0) over the M1 shape; designating a final M1 hard mask shape; designating a V0 retargeted litho shape; calculating an inner angle $\alpha$ between the final M1 hard mask shape and the V0 retargeted litho shape in terms of a horizontal distance x and a vertical distance y between V0 and the inner vertex; statistically representing manufacture of M1 and V0 based on the calculation and manufacturing environment process variations; calculating a baseline angle α1 between V0 and a final M1 hard mask shape having no inner vertex; simulating the calculation of the baseline angle α1; comparing results of the simulation with the statistical representation; and defining design rules for V0 based on a 3σ value of the baseline angle α1 from the simulation.

Aspects include calculating the inner angle α by: designating a corner rounding circle to approximate an inner vertex curve of the final M1 hard mask shape; defining a coordinate system in terms of the corner rounding circle radius and center, x and y, and a radius of the V0 retargeted litho shape; and applying geometric and algebraic principles. Further aspects include statistically representing manufacture of M1 and V0 by simulating the calculation of the inner angle α with manufacturing process variations. Additional aspects include the manufacturing process variations being overlay tolerance, CD tolerance, and LER tolerance. Another aspect includes plotting 3σ contours from the simulation of the calculation of the inner angle α in terms of x and y. Other aspects include plotting α value of the simulation of baseline angle α1 on the 3σ contours; and defining a minimum manufacturable distance between the SAV and the M1 inner vertex as a value of x corresponding to the baseline angle α1 on the 3σ contours.

Another aspect of the present disclosure is a method including drawing a M1 shape having an inner vertex; drawing a V0 over the M1 shape; designating a final M1 hard mask shape; designating a V0 retargeted litho shape; calculating an inner angle α between the final M1 hard mask shape and the V0 retargeted litho shape in terms of a horizontal distance x and a vertical distance y between V0 and the inner vertex; turning a mathematical model of the calculation into a script; running the script to simulate the calculation of the limiting parameter α as a function of x and y with manufacturing process variations; plotting 3σ contours from the simulation of the calculation of the limiting parameter α; calculating a baseline angle α1 between V0 and a final M1 hard mask shape having no inner vertex; simulating the calculation of the baseline angle α1; plotting a value of the simulation of baseline angle α1 on the 3σ contours; and designing a semiconductor cell with an SAV proximate to an M1 inner vertex, the cell having a limiting parameter α minimum value equal to the 3σ value of the baseline angle α1.

Aspects include the manufacturing process variations being overlay tolerance, CD tolerance, and LER tolerance variations. Further aspects include calculating the inner angle α by: designating a corner rounding circle to approximate an inner vertex curve of the final M1 hard mask shape; defining a coordinate system in terms of the corner rounding circle radius and center, x and y, and a radius of the V0 retargeted litho shape; and applying geometric and algebraic principles. Additional aspects include forming the designed semiconductor cell and filling the SAV with metal, the filled SAV having no voids.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of restrictions on V0 to M1 inner vertex distances attendant upon designing a semiconductor cell with an SAV and an M1 with an inner vertex. In accordance with embodiments of the present disclosure, a limiting parameter is calculated and the calculation simulated to create a statistical representation of the manufacturing outcome.

Methodology in accordance with embodiments of the present disclosure includes determining a limiting parameter α for manufacture of an SAV proximate to an M1 inner vertex; defining a coordinate system in terms of horizontal and vertical distances x and y, respectively, between the SAV and the M1 inner vertex angle; calculating the limiting parameter α as a function of x and y; simulating the calculation of α as a function of x and y; calculating a baseline angle α1 as a function of x and y; simulating calculation of the baseline angle α1 as a function of x and y; extracting a 3σ value of the baseline angle α1 from the simulation; and designing a semiconductor cell with an SAV proximate to an M1 inner vertex, the cell having a limiting parameter α minimum value equal to the 3σ value of the baseline angle α1.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2:
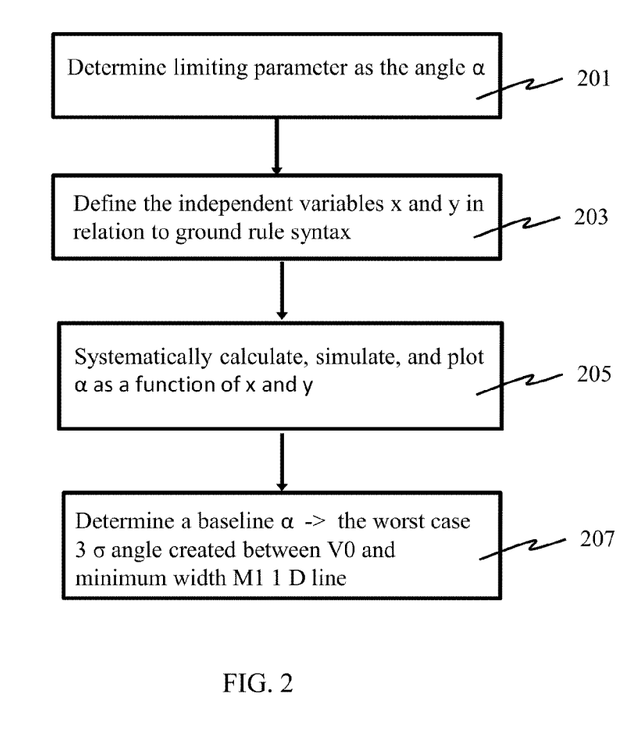
FIG. 2 schematically illustrates a process flow for determining a limiting parameter α, in accordance with an exemplary embodiment.

Adverting to FIG. 2, a process flow is outlined for an exemplary embodiment of the present disclosure. Specifically, first a limiting parameter α is determined in step 201. Next the independent variables x and y are defined in relation to the ground rule syntax (step 203). At step 205, the angle parameter α is systematically calculated, simulated, and plotted as a function of x and y, and last, a baseline is calculated to obtain the worst case 3σ angle created between V0 and a minimum width M1 1D line in step 207.

Figure 3A:
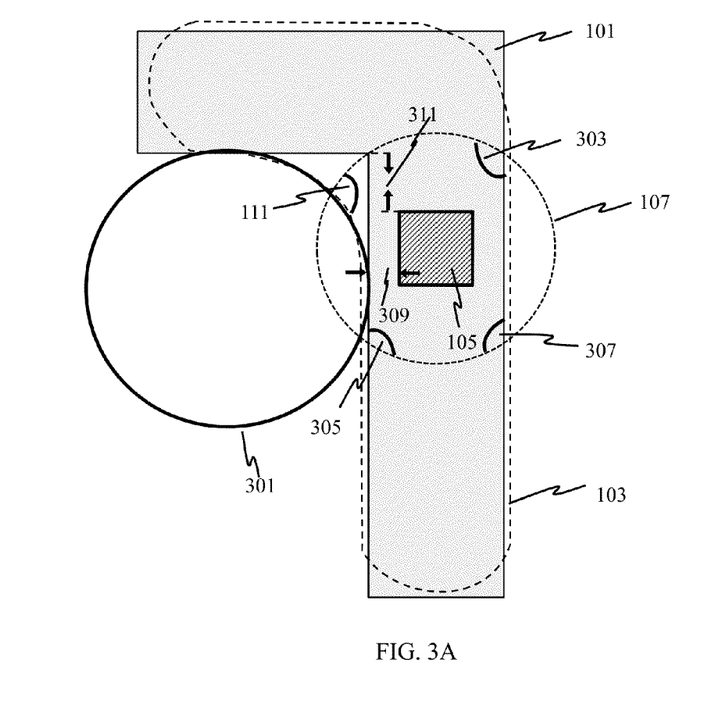
FIG. 3A schematically illustrates designation of the corner rounding circle and defining variables x and y, in accordance with an exemplary embodiment.
Figure 3B:
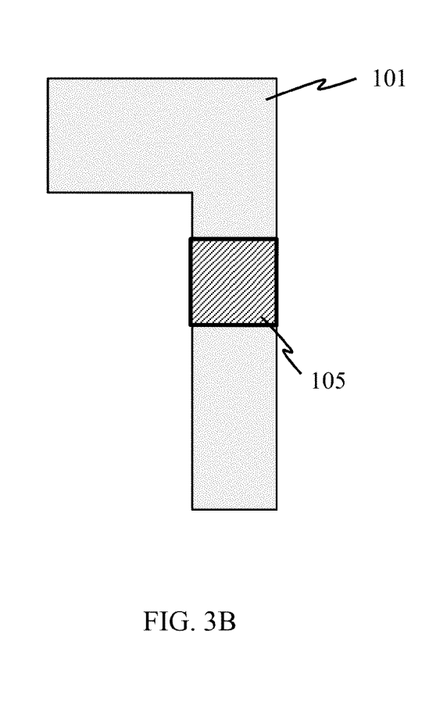
FIGS. 3B and 3C schematically illustrate different shapes for M1 and placements for V0, in accordance with an exemplary embodiment.
Figure 3C:
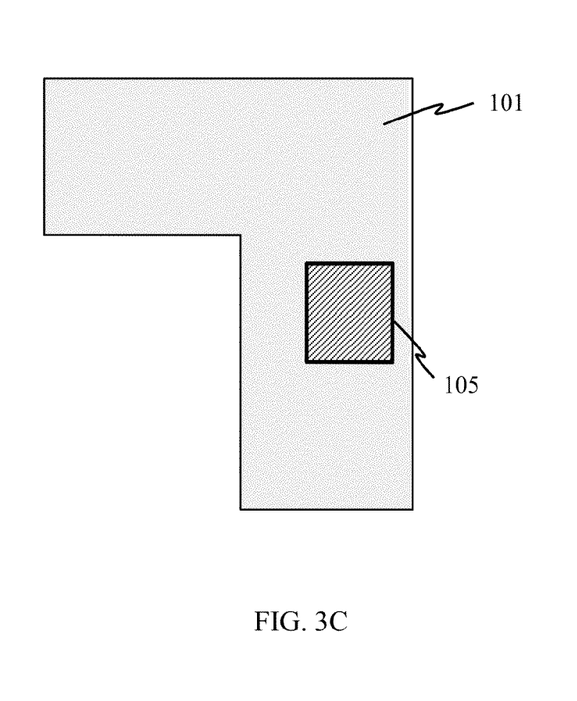

Each of the steps of FIG. 2 will now be explained starting with the elements of FIG. 1 (a drawn M1 shape 101, a final hard mask CD shape 103, a drawn V0 105, and a V0 retargeted litho shape 107). To determine the limiting parameter (step 201), first a corner rounding circle 301 is defined approximating the curved inner vertex of final hard mask CD shape 103, as illustrated in FIG. 3A. α will be the angle where V0 retargeted litho shape 107 intersects corner rounding circle 301. The worst case is when α is less than $\theta_1/\theta_2/\theta_3$ in which $\theta_1$ is angle 303, $\theta_2$ is angle 305, and $\theta_3$ is angle 307. For step 203, distance 309, the horizontal distance between drawn V0 105 and a vertical edge of M1 shape 101 (or the enclosure of V0 within the M1 inner-vertex edge horizontally), is defined as x, and distance 311, the vertical distance between drawn V0 and a M1 inner-vertex, is defined as y. FIGS. 3B and 3C show alternate shapes and sizes for M1 with a drawn V0 105 having a constant size of 32 nm from one to the other (based on a 40 nm technology node). As illustrated in FIG. 3B, x equals zero, and in FIG. 3C, V0 is shifted to the right (off center horizontally) such that x is greater than y.

Figure 4A:
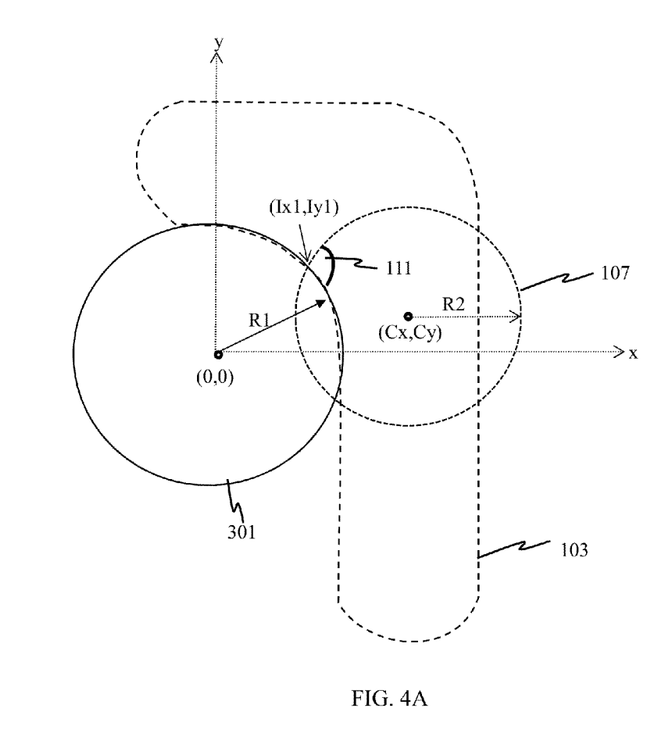
FIGS. 4A through 4C schematically illustrate calculation of α, in accordance with an exemplary embodiment.
Figure 4B:
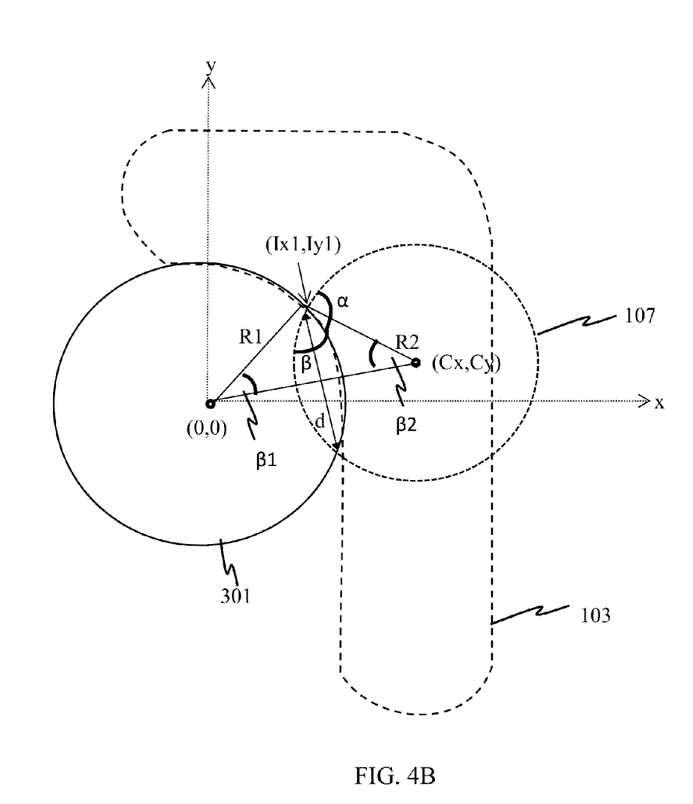
Figure 4C:
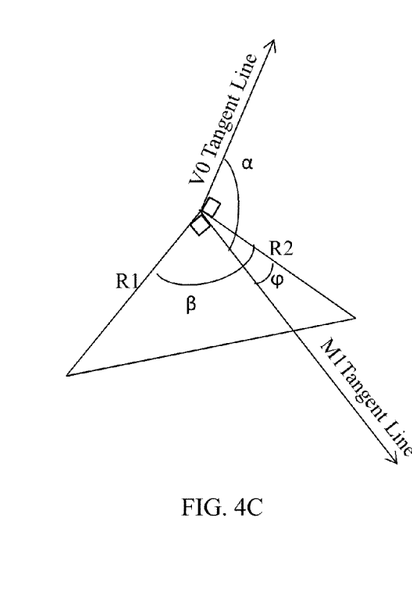

Adverting to FIGS. 4A through 4C (FIG. 4C being an expanded portion of FIG. 4B), parameter α (critical inner V0 angle 111) is calculated as a function of x and y and then simulated to generate a statistical representation of the parameter, in accordance with step 205. Specifically, the center and radius of corner rounding circle 301 are defined as point (0,0) and radius R1. The center and radius of V0 retargeted litho shape 107 are defined as point (Cx,Cy) and radius R2. Then:

$$R1 = CRR(40\ nm) + (M1CDU * RN1) \quad (1)$$

$$R2 = V0\ \text{Retargeted litho shape radius} = 25\ nm + (V0CDU * RN2) \quad (2)$$

$$ENx = \text{Enclosure in the } x \text{ direction, or } x \text{ from FIG. 3}A \quad (3)$$

$$Cx = R1 + ENx = 16\ nm + (M1/V0OVLYx * RN3) \quad (4)$$

$$Cy = CRR - y + (M1/V0OVLYy * RN4), \quad (5)$$

in which CRR is the corner rounding radius (a known value), M1CDU is the M1 CD tolerance that the fab is known to be able to meet, RNx is a pseudorandom number pulled from the normal distribution of the 3σ overlay value, V0CDU is the V0 CD tolerance that the fab is known to be able to meet, M1/V0OVLYx is the M1 to V0 overlay in the x direction, and M1/V0OVLYy is the M1 to V0 overlay in the y direction.

Next, a method can be determined to calculate the angle created between the two tangent lines (V0 tangent and M1 tangent) of the two circles at the point that they intersect. The smallest angle of the two intersection points should be used for worst case situations. The angle α can be determined by finding the top most intersection point (Ix1, Iy2) of the two circles and applying geometric and algebraic principles to solve for the angle as follows:

$$x = \frac{x_2 + x_1}{2} + \quad (5)$$
$$\frac{(x_2 - x_1)(r_1^2 - r_2^2)}{2d^2} \pm \frac{y_2 - y_1}{2d^2}\sqrt{((r_1+r_2)^2 - d^2)(d^2 - (r_2-r_1)^2)},$$

$$y = \frac{y_2 + y_1}{2} + \quad (6)$$
$$\frac{(y_2 - y_1)(r_1^2 - r_2^2)}{2d^2} \pm \frac{x_2 - x_1}{2d^2}\sqrt{((r_1+r_2)^2 - d^2)(d^2 - (r_2-r_1)^2)},$$

and $$d = \sqrt{(x_2 - x_1)^2 + (y_2 - y_1)^2}, \quad (7)$$

in which $(x_1, y_1) = (0,0)$, $x_2 = C_x = R1 + Enx + 16$ nm, $y_2 = C_y = 24$ nm to $-24$ nm, $(I_{x1}, I_{y1}) =$ point of intersection 1, and $(I_{x2}, I_{y2}) =$ point of intersection 2. Further, looking at FIG. 4C, β equals $90° + \phi$, $\alpha = 90° + \phi$, and $\alpha = \beta = 180° - (\beta1 + \beta2)$.

Figure 5:
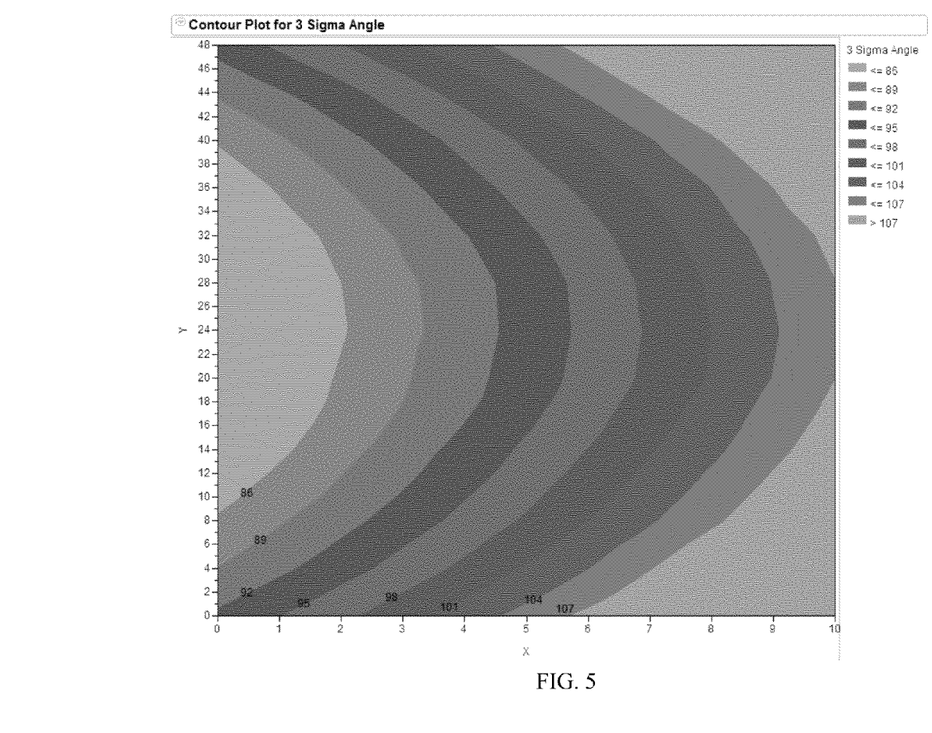
FIG. 5 schematically illustrates a contour plot of the simulation of the calculation of α for 3σ, in accordance with an exemplary embodiment.

Returning to FIG. 2, once parameter α is calculated, a method is determined for turning the mathematical model into a script and simulating the calculation with overlay tolerance, CD tolerances, and LER tolerance process variations included to create a probability distribution of data that can be used to statistically represent the manufacturing environment outcome. This can be performed via excel, or any other program. Large excel macros have been written to simulate the limiting parameter α and run, for example, 60,000 to 100,000 times to generate a statistical representation of the parameter. FIG. 5 is a contour plot of the 3σ value distribution (0.3% of the smallest angles) from the results from the simulation script.

Figure 6A:
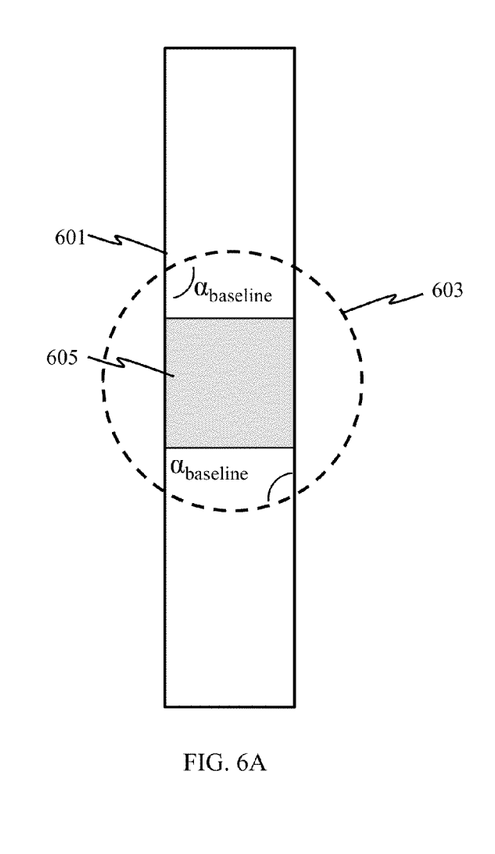
FIGS. 6A and 6B schematically illustrate baseline angle $\alpha_{baseline}$, in accordance with an exemplary embodiment.
Figure 6B:
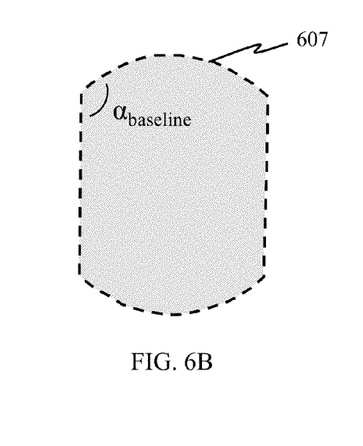
Figure 7:
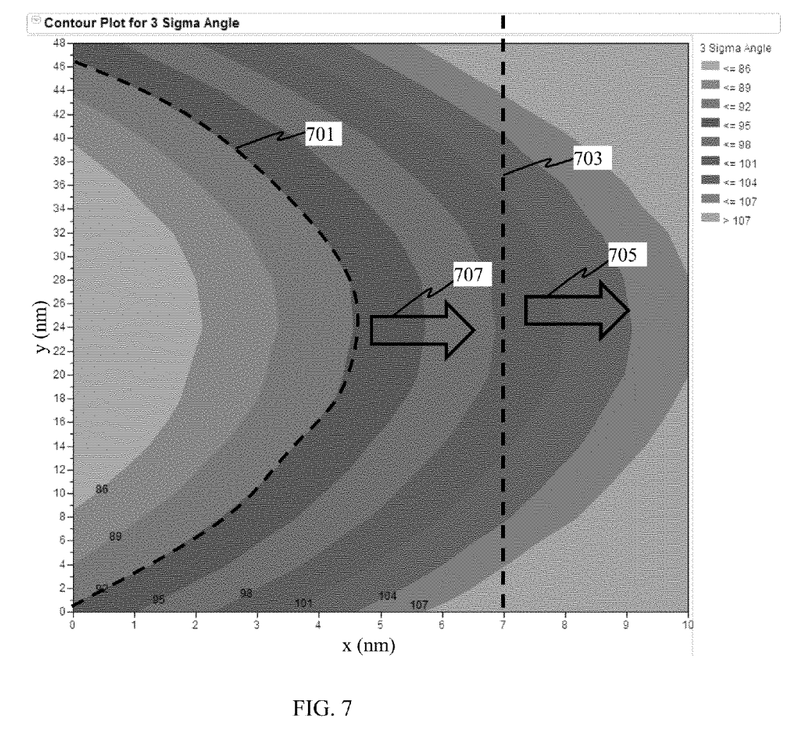
FIG. 7 schematically illustrates a comparison of results of the baseline angle $\alpha_{baseline}$ simulation with current V0/M1 rules, in accordance with an exemplary embodiment.

Integration has already committed to filling V0 vias on minimum width M1 lines. The angle $\alpha_{baseline}$, the intersection between a vertical edge 601 of M1 and V0 retargeted litho shape 603, as shown in FIG. 6A, can be calculated easily and simulated with the same method used for the critical parameter α. Here, instead of using a corner rounding circle, a vertical edge is employed, which is effectively a circle with an infinite radius. The result is final via shape 607, illustrated in FIG. 6B. As an example of a baseline simulation, M1 edge 501 is taken as corner rounding circle with a radius of 10,000 nm. Further, V0CDU is 14.8, M1CDU (for the circle) is 7.2 nm, M1/V0 overlay is 11.5, the radius of V0 retargeted litho shape 603 is 25 nm, V0 drawn width and length are each 32 nm, and M1 drawn has a width of 32 nm. 50,500 cases of V0 on minimum width M1 produce simulation results of a minimum angle of 89.8°, a normalized 3σ angle of 91.3 degrees (illustrated in the contour plot of FIG. 7 by contour line 701), and a 4σ angle of 89.9°. With this baseline information, the original contour plot can be joined together and presented to the integration team to show how the via distance to inner-vertex rules can be pushed to meet design team needs and ensure manufacturability risk is low. Specifically, as shown in FIG. 7, though V0/M1 rules set x as greater than 7 nm, with everything to the right of line 703 being fillable (indicated by arrow 705), a baseline 3σ value for α suggests that anything to right of contour line 701 (indicated by arrow 707) will be fillable.

Ground rules can now be created that allow the design team to create a competitive standard cell. Furthermore, the ground rules can be simplified, as many previously required rules can now be removed. In 640 nm/576 nm standard cells, 70% to 85% of V0s take advantage of this rule. There is still room to reduce the ground rule value if standard cell development depends on it. This method can be shared with other SAV technologies.

The embodiments of the present disclosure can achieve several technical effects including reducing design restrictions on SAVs near an M1 inner vertex. The present disclosure enjoys industrial applicability in any of highly integrated semiconductor devices, particularly for 20 nm technologies and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    determining a limiting parameter $\alpha$ for manufacture of a self-aligned via (SAV) proximate to a metal 1 (M1) inner vertex;
    defining a coordinate system in terms of horizontal and vertical distances x and y, respectively, between the SAV and the M1 inner vertex angle;
    calculating the limiting parameter $\alpha$ as a function of x and y;
    simulating the calculation of $\alpha$ as a function of x and y;
    calculating a baseline angle $\alpha 1$ as a function of x and y;
    simulating calculation of the baseline angle $\alpha 1$ as a function of x and y;
    extracting a $3\sigma$ value of the baseline angle $\alpha 1$ from the simulation;
    designing a semiconductor cell with an SAV proximate to an M1 inner vertex, the cell having a limiting parameter $\alpha$ minimum value equal to the $3\sigma$ value of the baseline angle $\alpha 1$; and
    manufacturing a semiconductor device including the designed semiconductor cell.

2. The method according to claim 1, comprising determining the limiting parameter $\alpha$ by:
    drawing an M1 shape;
    determining a final hard mask for M1;
    drawing a via;
    determining a via retargeted litho shape; and
    setting as the limiting parameter $\alpha$ an angle formed between and within the via retargeted litho shape and the final hard mask for M1.

3. The method according to claim 2, comprising calculating the limiting parameter $\alpha$ by determining a corner rounding circle approximating a curve at an inner vertex of the final hard mask and employing geometric and algebraic principles.

4. The method according to claim 1, comprising creating a probability distribution to statistically represent manufacture of M1 and the SAV from the simulation of the calculation of the limiting parameter $\alpha$.

5. The method according to claim 1, comprising simulating the calculation of the limiting parameter $\alpha$ with overly tolerance variations.

6. The method according to claim 1, comprising simulating the calculation of the limiting parameter $\alpha$ with critical dimension (CD) tolerance variations.

7. The method according to claim 1, comprising simulating the calculation of the limiting parameter $\alpha$ with line edge roughness (LER) tolerance variations.

8. The method according to claim 1, comprising plotting $3\sigma$ contours from the simulation of the calculation of the limiting parameter $\alpha$.

9. The method according to claim 8, comprising locating the $3\sigma$ value of the baseline angle $\alpha 1$ on the $3\sigma$ contours and designating a value of x corresponding to the $3\sigma$ value of the baseline angle $\alpha 1$ as the minimum manufacturable distance between the SAV and the M1 inner vertex.

10. A method of fabricating a semiconductor device, the method comprising:
    drawing a metal 1 (M1) shape having an inner vertex;
    drawing a via (V0) over the M1 shape;
    designating a final M1 hard mask shape;
    designating a V0 retargeted litho shape;
    calculating an inner angle $\alpha$ between the final M1 hard mask shape and the V0 retargeted litho shape in terms of a horizontal distance x and a vertical distance y between V0 and the inner vertex;
    statistically representing manufacture of M1 and V0 based on the calculation and manufacturing environment process variations;
    calculating a baseline angle $\alpha 1$ between V0 and a final M1 hard mask shape having no inner vertex;
    simulating the calculation of the baseline angle $\alpha 1$;
    comparing results of the simulation with the statistical representation;
    defining design rules for V0 based on a $3\sigma$ value of the baseline angle $\alpha 1$ from the simulation;
    designing a semiconductor cell based on the defined design rules; and
    manufacturing the semiconductor device including the designed semiconductor cell.

11. The method according to claim 10, comprising calculating the inner angle $\alpha$ by:
    designating a corner rounding circle to approximate an inner vertex curve of the final M1 hard mask shape;
    defining a coordinate system in terms of the corner rounding circle radius and center, x and y, and a radius of the V0 retargeted litho shape; and
    applying geometric and algebraic principles.

12. The method according to claim 10, comprising statistically representing manufacture of M1 and V0 by simulating the calculation of the inner angle $\alpha$ with manufacturing process variations.

13. The method according to claim 12, wherein the manufacturing process variations comprise overlay tolerance.

14. The method according to claim 12, wherein the manufacturing process variations comprise critical dimension (CD) tolerance.

15. The method according to claim 12, wherein the manufacturing process variations comprise line edge roughness (LER) tolerance.

16. The method according to claim 12, further comprising plotting $3\sigma$ contours from the simulation of the calculation of the inner angle $\alpha$ in terms of x and y.

17. The method according to claim 16, comprising:
    plotting a value of the simulation of baseline angle $\alpha 1$ on the $3\sigma$ contours; and
    defining a minimum manufacturable distance between the SAV and the M1 inner vertex as a value of x corresponding to the baseline angle $\alpha 1$ on the $3\sigma$ contours.

18. A method comprising:
drawing a metal 1 (M1) shape having an inner vertex;
drawing a via (V0) over the M1 shape;
designating a final M1 hard mask shape;
designating a V0 retargeted litho shape;
calculating an inner angle $\alpha$ between the final M1 hard mask shape and the V0 retargeted litho shape in terms of a horizontal distance x and a vertical distance y between V0 and the inner vertex;
turning a mathematical model of the calculation into a script;
running the script to simulate the calculation of the limiting parameter $\alpha$ as a function of x and y with manufacturing process variations;
plotting $3\sigma$ contours from the simulation of the calculation of the limiting parameter $\alpha$:
calculating a baseline angle $\alpha 1$ between V0 and a final M1 hard mask shape having no inner vertex;
simulating the calculation of the baseline angle $\alpha 1$;
plotting a value of the simulation of baseline angle $\alpha 1$ on the $3\sigma$ contours;
designing a semiconductor cell with an SAV proximate to an M1 inner vertex, the cell having a limiting parameter $\alpha$ minimum value equal to the $3\sigma$ value of the baseline angle $\alpha 1$; and
manufacturing a semiconductor device including the designed semiconductor cell.

19. The method according to claim 18, wherein the manufacturing process variations comprise overlay tolerance, critical dimension (CD) tolerance, and line edge roughness (LER) tolerance variations.

20. The method according to claim 18, comprising calculating the inner angle $\alpha$ by:
designating a corner rounding circle to approximate an inner vertex curve of the final M1 hard mask shape;
defining a coordinate system in terms of the corner rounding circle radius and center, x and y, and a radius of the V0 retargeted litho shape; and
applying geometric and algebraic principles.

21. The method according to claim 18, further comprising forming the designed semiconductor cell and filling the SAV with metal, the filled SAV having no voids.

* * * * *